United States Patent [19]

Billings

[11] 4,346,375

[45] Aug. 24, 1982

[54] SOLID STATE STATUS INDICATION CIRCUIT FOR POWER CONTROLLERS

[75] Inventor: William W. Billings, Lima, Ohio

[73] Assignee: Westinghouse Electric Corp., Pittsburgh, Pa.

[21] Appl. No.: 181,568

[22] Filed: Aug. 27, 1980

[51] Int. Cl.³ .............................................. G08B 21/00
[52] U.S. Cl. .................................... 340/644; 307/350; 307/363; 324/133; 340/663; 340/664
[58] Field of Search ............... 340/644, 654, 664, 328, 340/663; 324/133, 51, 65 R; 328/148, 151; 307/573, 581, 350, 363, 127, 130; 361/92, 115

[56] References Cited

U.S. PATENT DOCUMENTS 3,469,112 9/1969 Hands et al. .................... 328/151 X
3,852,736 12/1974 Cook et al. ..................... 340/573 X
4,020,417 4/1977 Brehob et al. ..................... 324/65 R Primary Examiner—John W. Caldwell, Sr.
Assistant Examiner—Daniel Myer
Attorney, Agent, or Firm—G. H. Telfer

[57] ABSTRACT

A solid-state power controller in combination with a solid-state indication circuit is reminded for exhibiting OFF status using a depletion mode field effect transistor that permits an active signal to appear at its source and drain terminals when its gate, coupled to the power controller, is not energized. Such OFF indication circuitry is also combined with solid state ON indication circuitry using a device such as a bipolar transistor to exhibit an output when its base, coupled to the power controller, is supplied a signal.

2 Claims, 2 Drawing Figures

SOLID STATE STATUS INDICATION CIRCUIT FOR POWER CONTROLLERS

BACKGROUND AND SUMMARY OF THE INVENTION

This invention relates to solid state power controllers and particularly to indication circuitry for indicating the status of the power controller while using all solid state components.

Solid state power controllers are generally known that exhibit the performance that is the equivalent of an electromechanical circuit breaker but using no mechanical elements. Such circuit breakers or power controllers are disclosed, for example, in copending applications Ser. Nos. 023,361 and 023,368, respectively, by Billings et al. and Mitchell et al. and both filed Mar. 23, 1979 and assigned to the present assignee, now respectively issued as U.S. Pat. Nos. 4,245,184, and 4,245,185, Jan. 13, 1981. Such apparatus is highly useful and effective and may be made more effective by combining it with additional means for providing an electrical signal indicative of the status of the power controller, namely whether the power controller is ON and conduction should be occurring between the supply and load with which it is associated or whether the power controller is OFF, such as by having been tripped out, so that no conduction is occurring in the load circuit. The generation of a positive electrical signal indicative of these different states is very useful. One way in which it can be used is to indicate the status to the operator, such as by lighting a lamp in the event of either an ON or an OFF signal. Alternatively, such a signal may be applied to logic circuitry or other control circuitry in order to initiate some more complex sequence of events such as attempts to initiate turn on in the event of an OFF signal upon determination of any number of criteria.

Status indication in solid state power controllers has in the past been accomplished by the use of miniature relays. In this manner, a normally closed (NC, or Form "B") relay circuit will permit active status indication of an OFF state because during the ON state, the normally closed relay will have a signal applied to it that results in its interruption and therefore the absence of the OFF signal. For ON state indication, it has similarly been suitable to use a normally open (NO, or Form "A") relay circuit so that the status indication occurs upon the application of the signal from the power controller that closes the normally open relay. Combinations of normally open and normally closed relays (Form "C") may indicate both ON and OFF states.

Miniature relays can perform active status indication for both ON and OFF states but are undesirable in some applications because they do not have the reliability, durability and environmental advantages of a solid state circuit.

In addition, it is known that some status indication can be achieved utilizing solid state devices that may be characterized as of the sinking type. These may be an output transistor, such as a conventional bipolar transistor, that for the ON state, or a logical "1", is energized by a base signal from the power controller so as to be conductive in its collector-emitter circuit. The OFF state, or logical "0" state, is indicated by the absence of the output transistor base signal so that its collector emitter circuit is non-conductive or virtually an open circuit.

The use of a single element such as a bipolar transistor to provide both ON and OFF state indications does not satisfy the need for active status indication of both states. That is because it passively indicates the OFF state by the absence of an output indication signal. Such an indication may result from a malfunction of one of the operative components as well as from the existence of the OFF state.

The present invention addresses the foregoing considerations and provides a unique solution in the form of a totally solid state indication circuit having the capability of providing an active OFF status signal. The disclosed circuit utilizes a depletion mode field effect transistor to provide the OFF indication. This known type of device has the characteristics of being normally conductive in the absence of a gate signal and is rendered non-conductive by the application of a gate signal. Thus, its use permits the working current in the status circuit between its source and drain to flow and provide an output during all times when the gate signal is not present as a result of the power controller being OFF.

In addition, arrangements are provided in which both ON and OFF active status indication is given. These include a combination of a depletion mode field effect transistor with another semiconductor device such as a bipolar transistor or an enhancement mode field effect transistor in a series arrangement in the status indication circuitry with a common branch therebetween. The circuit portion containing the depletion mode field effect transistor provides an active status signal upon OFF conditions of the power controller, that is, when its gate signal is absent. The other device, such as a bipolar transistor, will provide an active status signal of the ON condition during times when the control signal to its base is on.

In this way, new solid-state indication circuits analogous to relay circuits of either form B or form C can be provided. There is a positive conductive indication exhibited for each state.

DESCRIPTION OF THE PREFERRED EMBODIMENTS

Figure 1:
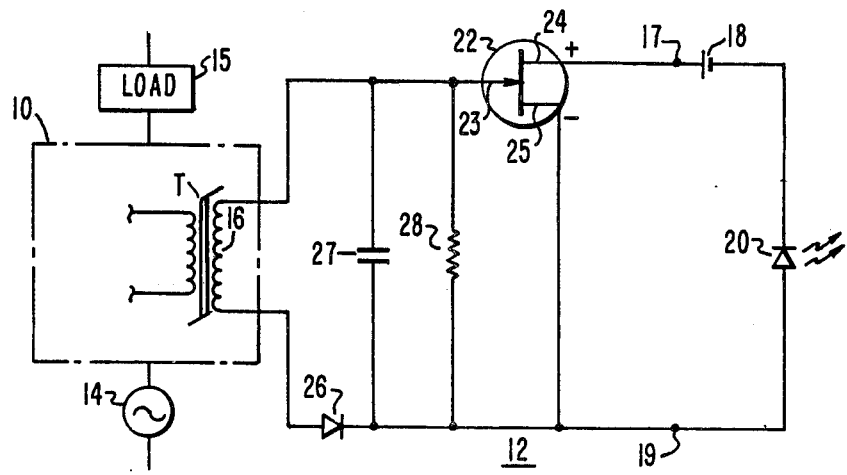
FIG. 1 is a circuit schematic of one embodiment of the present invention.

In FIG. 1, a solid state power controller represented by block 10 is shown in combination with an auxiliary indication circuit 12 for providing OFF state indication. The solid state power controller 10 may be in accordance with prior practice for controlling the supply of power between a supply 14 and a load 15 such as is disclosed in the copending applications.

The indication circuit 12 works off of two inputs. One input is from a means 16 for deriving a signal indicating an ON state of the power controller which is represented in this embodiment by transformer winding 16 on the drive transformer T that provides drive to the solid state power controller power stage. Transformer T is energized whenever the power controller is ON and is deenergized, and the voltage appearing across the winding 16 is zero, whenever the power controller is in the OFF condition. An input from the power controller 10 to the indication circuit 12 may also be provided by other suitable means directly responsive to the state of the power controller. It is assumed in this embodiment that the power controller is one for an AC load circuit although it will be understood that the invention can be readily adapted to application to DC power controllers.

The other input to the indication circuit is from an independent voltage source 18 of direct voltage that is applied across indication output terminals 17 and 19. This external voltage is intended to be applied at all times the circuit is in use. The function of this embodiment of the indication circuit 12 is to provide a current signal at the indication output terminals only when the power controller is OFF. The current may, merely as one example, be used to light a light emitting diode 20.

A semiconductive device 22 is provided in the indication circuit for responding to an ON signal from the power controller to stop conduction between the status signal output terminals 17 and 19. The device 22 is preferably a depletion mode field effect transistor whose source 24 and drain 25 terminals are connected in the outer indication circuit. The gate terminal 23 of the depletion mode field effect transistor 22 is connected to receive the transformer voltage on winding 16 from the power controller.

When the power controller 10 is OFF, it can be seen that there will be no gate signal applied to the field effect transistor 22. Consequently, conduction is maintained between the indication output terminals 17 and 19 indicating the OFF status of the power controller. When the power controller is ON, the signal from the transformer is rectified by a diode rectifier 26 and voltage is impressed upon a capacitor 27 and resistor 28 connected in parallel with each other. This applies sufficient gate voltage so that the conduction between the source and drain terminals 24 and 25 of the transistor is prevented and therefore the OFF status signal at the output terminals is not indicated.

Figure 2:
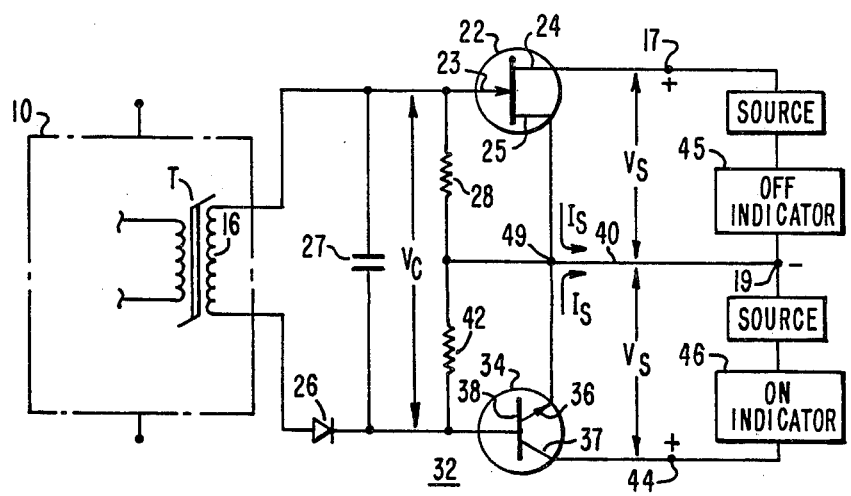
FIG. 2 is a circuit schematic of another embodiment of the present invention.

FIG. 2 shows an indication circuit 32 that has operative elements for indicating either an OFF or ON status of the power controller 10. Several of the elements shown are like those illustrated in FIG. 1 for providing an OFF status indication signal and bear like numbers. In addition, a second semiconductive device 34, here illustrated as a bipolar transistor, has collector and emitter terminals 36 and 37, respectively, connected in the status indication output circuit with its base terminal 38 associated with the transformer of the power circuit through rectifier 26. A common line 40 extends between resistors 28 and 42 associated with respective ones of the transistors 22 and 34, their midpoint and the point of low voltage in the output circuit. Thus, there is applied a voltage across terminals 17 and 19 between the source and drain terminals 24 and 25 of the field effect transistor and another voltage across terminals 44 and 19 and across the emitter and collector terminals 36 and 37 of the bipolar transistor 34 with a common point at terminal 19 provided by the common line 40. What is intended is to provide independent status indication from each pair of output terminals 17-19 and 44-19 so that there is a status signal in the upper portion upon the power controller being OFF and a status signal in the lower portion upon the power controller being ON so that in each instance one of the status signals will be present and one of the indicators 45 and 46 energized.

In this description and FIG. 2, two voltage sources are referred to that are connected respectively across terminals 17-19 and 19-44. However, there may instead be a single source connected in the common line between points 19 and 49 that provides both the voltages across the indication circuits.

The operation of the bipolar transistor 34 is such that its base signal is derived from the rectified transformer signal and will be present at all times the power controller is ON to permit conduction between its emitter and collector terminals 36 and 37. In the absence of that base signal, that is when the power controller is OFF, conduction of current through the emitter and collector of the transistor is prevented. The circuit portion including the depletion mode field effect transistor 22 operates in accordance with that of FIG. 1.

The following table presents suitable components and circuit values, by way of further example, for the implementation of circuits in accordance with FIG. 2 that have been demonstrated to be successful in operation.

| | |
|---|---|
| Depletion mode field effect transistor 22 | 2N3972 |
| Bipolar transistor 34 | 2N3700 |
| Resistor 28 | 5,000 ohms |
| Resistor 42 | 20,000 ohms |
| Capacitor voltage, $V_C$ | 5 volts |
| Status voltages, $V_S$, each | 30 volts (maximum value) |
| Status currents, $I_S$, each | 10 ma. (rated value) |

The circuit as described has been found to perform effectively over a temperature range of −40° C. to +85° C. When field effect transistor 23 conducts, the voltage drop across its source and drain is 0.773 volts maximum. When bipolar transistor 34 conducts, the voltage drop across its emitter and collector is 0.043 volts maximum.

In the foregoing demonstration, the status voltages and currents, $V_S$ and $I_S$, were measured without using LED indicators.

Consequently, the present invention provides a distinct advantage over the prior art by providing a solid state indication circuit for indicating OFF status of a power controller when the power controller is deenergized and it may be applied as an individual indication circuit as in FIG. 1 or coupled with an ON status indication circuit that is also all solid state as in FIG. 2. The invention may be applied in various forms, but it is preferred to employ the depletion mode field effect transistor as such devices have the desired characteristic of responding to an applied gate signal to terminate conduction between source and drain and such devices are commercially available at present that cover a wide range of requirements up to 80 volts and 500 milliamperes. Thus, the power controller itself as well as its auxiliary circuits may be made entirely solid state, highly reliable and with modest power requirements.

It is apparent that various modifications and variations may be made in the illustrative embodiments to adapt the invention to particular applications consistent with the teachings of the present invention.

I claim:

1. Solid state indication circuitry to indicate either the ON or OFF status of a power circuit comprising:
   means associated with the power circuit for producing a first voltage only upon the power circuit being ON;
   means for applying second and third voltages, independent of said first voltage, respectively across first and second pairs of status indicating output terminals of which one terminal of each of said first and second pairs is connected to a common terminal;

voltage divider means for establishing fourth and fifth voltages, developed from said first voltage, between said common terminal and first and second control terminals respectively of first and second respective semiconductive devices;

said first semiconductive device being a depletion mode field effect transistor having first and second terminals connected to said first pair of output terminals and conduction therebetween indicating an OFF state of the power circuit occurs upon said fourth voltage being at a low level; and said second semiconductive device having first and second terminals connected to said second pair of output terminals and conduction therebetween indicating an ON state of the power circuit occurs upon said fifth voltage being at a high level.

2. Solid state indication circuitry in accordance with claim 1 wherein said second semiconductive device is a bipolar transistor.

* * * * *

UNITED STATES PATENT AND TRADEMARK OFFICE
CERTIFICATE OF CORRECTION

PATENT NO. : 4,346,375

DATED : August 24, 1982

INVENTOR(S) : William W. Billings

It is certified that error appears in the above—identified patent and that said Letters Patent is hereby corrected as shown below:

In the Abstract, line 2, cancel "reminded" and substitute -- provided --.

Column 1, line 12, cancel "the", first occurrence.

Column 1, line 13, cancel "using" and substitute -- use --.

Column 3, line 3, cancel "to", first occurrence, and substitute -- for --.

Column 3, line 43, cancel "36 and 37" and substitute -- 37 and 36 --.

Column 4, line 29, cancel "23" and substitute -- 22 --.

Signed and Sealed this

Twenty-third Day of August 1983

[SEAL]

Attest:

GERALD J. MOSSINGHOFF

*Attesting Officer*     *Commissioner of Patents and Trademarks*